United States Patent [19]
Thelen et al.

[11] 3,991,707
[45] Nov. 16, 1976

[54] VAPOR DEPOSITION APPARATUS WITH MASK MEANS

[75] Inventors: Alfred J. Thelen; John A. Aguilera, both of Santa Rosa; James N. Grant, Healdsburg; George Eugene Michel, Santa Rosa, all of Calif.

[73] Assignee: Optical Coating Laboratory, Inc., Santa Rosa, Calif.

[22] Filed: Mar. 24, 1971

[21] Appl. No.: 127,783

Related U.S. Application Data

[63] Continuation of Ser. No. 751,695, Aug. 6, 1968, abandoned, which is a continuation of Ser. No. 522,738, Jan. 24, 1966, abandoned.

[52] U.S. Cl. .................................. 118/9; 118/49
[51] Int. Cl.² ........................................ C23C 13/08
[58] Field of Search ............ 118/301, 504, 48–49.5, 118/8, 9; 427/50–52, 69, 70, 78, 91, 99, 109, 124, 166, 167, 248–255, 259

[56] References Cited

UNITED STATES PATENTS

| | | | |
|---|---|---|---|
| 2,351,537 | 6/1944 | Osterberg et al. | 118/49 |
| 2,997,979 | 8/1961 | Tassara | 118/49 |
| 3,048,146 | 8/1962 | Coppola | 118/301 |

*Primary Examiner*—Morris Kaplan
*Attorney, Agent, or Firm*—Flehr, Hohbach, Test, Albritton & Herbert

[57] ABSTRACT

In vapor deposition apparatus, a plurality of spaced substrates on a rotatable horizontally disposed support, a vapor source disposed below said support and offset with respect to the axis of rotation of the support, and a mask extending approximately 180° which is uniformly disposed and diametrically opposed with respect to said source whereby the effective vapor stream is generally normal to exposed substrates. A continuously exposed monitor chip is provided.

2 Claims, 4 Drawing Figures

VAPOR DEPOSITION APPARATUS WITH MASK MEANS

This application is a continuation of application Ser. No. 751,695, filed Aug. 6, 1968, now abandoned, which was in turn a continuation of application Ser. No. 522,738, filed Jan. 24, 1966, now abandoned.

This invention relates to a coating apparatus and more particularly to a coating apparatus and method for increasing the accuracy of deposition and reducing the angle of incidence of the vapor stream during the coating operation.

In coating machines and apparatus heretofore provided, it always has been difficult to control the accuracy of the deposition and also to limit the angles of incidence. There is, therefore, a need for a new and improved coating apparatus and method.

In general, it is an object of the invention to provide a coating apparatus in which it is possible to increase the accuracy of deposition.

A further object of the invention is to provide a coating apparatus and method of the above character in which it is possible to reduce the angle of incidence of the vapor stream on the substrate.

A further object of the invention is to provide a coating apparatus of the above character in which a centrally disposed optical monitor can be utilized.

Additional objects and features of the invention will appear from the following description in which the preferred embodiment is set forth in detail in conjunction with the accompanying drawings.

Referring to the drawings.

Figure 4:
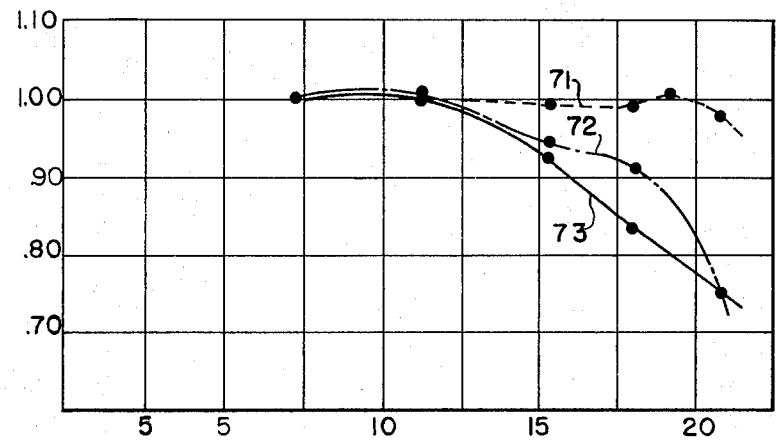
FIG. 4 is a graph showing the film thickness on the substrate versus rack radius for various situations.
Figure 1:
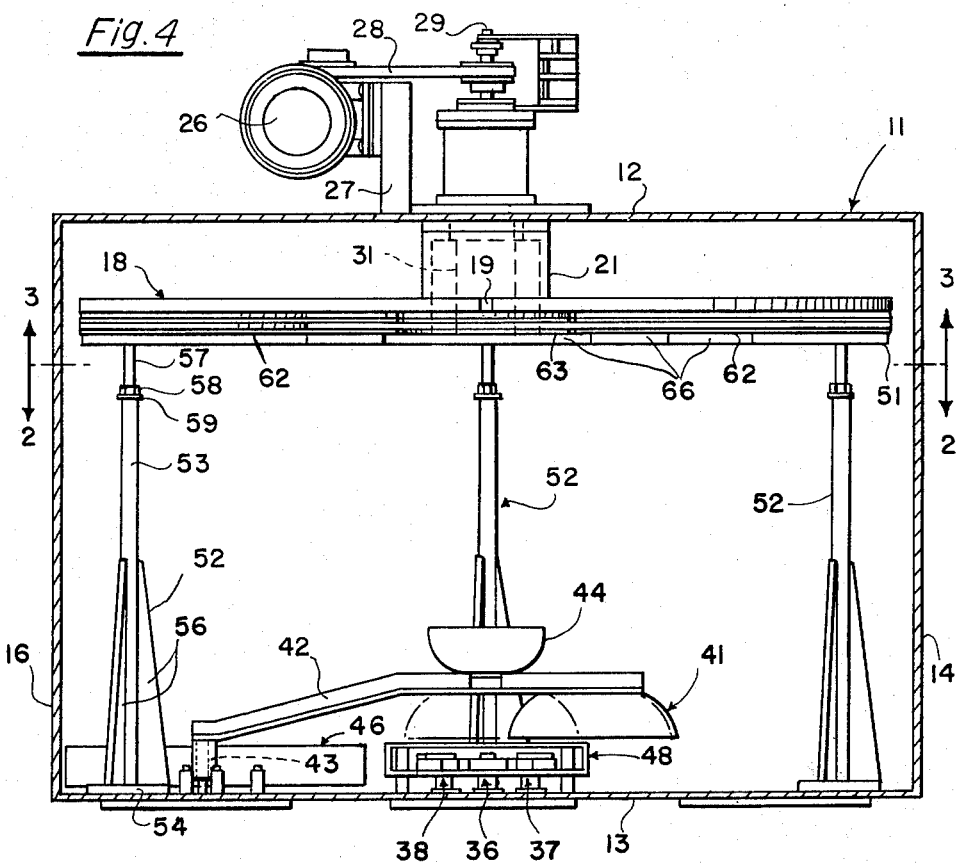
FIG. 1 is a side elevational view of a coating apparatus incorporating the present invention.

In general, the present coating apparatus comprises a vacuum chamber in which a rack is mounted in the chamber and is adapted to carry a plurality of substrates to be coated. Means is provided for rotating the rack and the substrates carried thereby during the coating operation. A source is disposed in the chamber and contains a coating material which evaporates when heated to produce a vapor stream which impinges upon the substrates carried by the rack. A stationary mask or shield is mounted in the chamber and is disposed between the source and the rack so that it interrupts a substantial portion of the vapor stream. In addition, it is positioned so that it interrupts the portions of the vapor stream having the greatest angles of incidence with respect to the substrates.

As shown in the drawing, the coating apparatus consists of a vacuum chamber or housing 11 which has top and bottom walls 12 and 13, a U-shaped side wall 14 and front wall 16. The front wall 16 has a normally removable front door which has been shown as a solid wall for convenience of illustration.

A rack 18 is disposed within the chamber 11 and near the upper part thereof. The rack 18 is of conventional construction and is provided with ribs 19 which extend at 90° angles from a central hub 21. Quadrant-like plates 22 are supported by the ribs 19 and are provided with a plurality of openings 23 of various sizes and shapes. Substrates to be coated are adapted to be placed on the rack 18 so that the areas to be coated face downwardly through the openings 23.

Means is provided for rotating the rack 18 during the coating operation and consists of the gear motor 26 mounted upon a bracket 27 secured to the top wall 12 of the housing 11. The motor drives a belt 28 which drives a shaft 29 which causes rotation of the hub 21. The drive motor 26 and the other associated parts form a part of a centrally disposed chip changer of the type disclosed in copending application Ser. No. 522,697, filed Jan. 24, 1966, now abandoned. As disclosed therein, the chip changer includes a centrally disposed cage 31 which contains a plurality of chips. As also explained in the copending application, after each layer, a chip is dropped from the chip changer to expose a new chip within the chamber housing 11.

Figure 2:
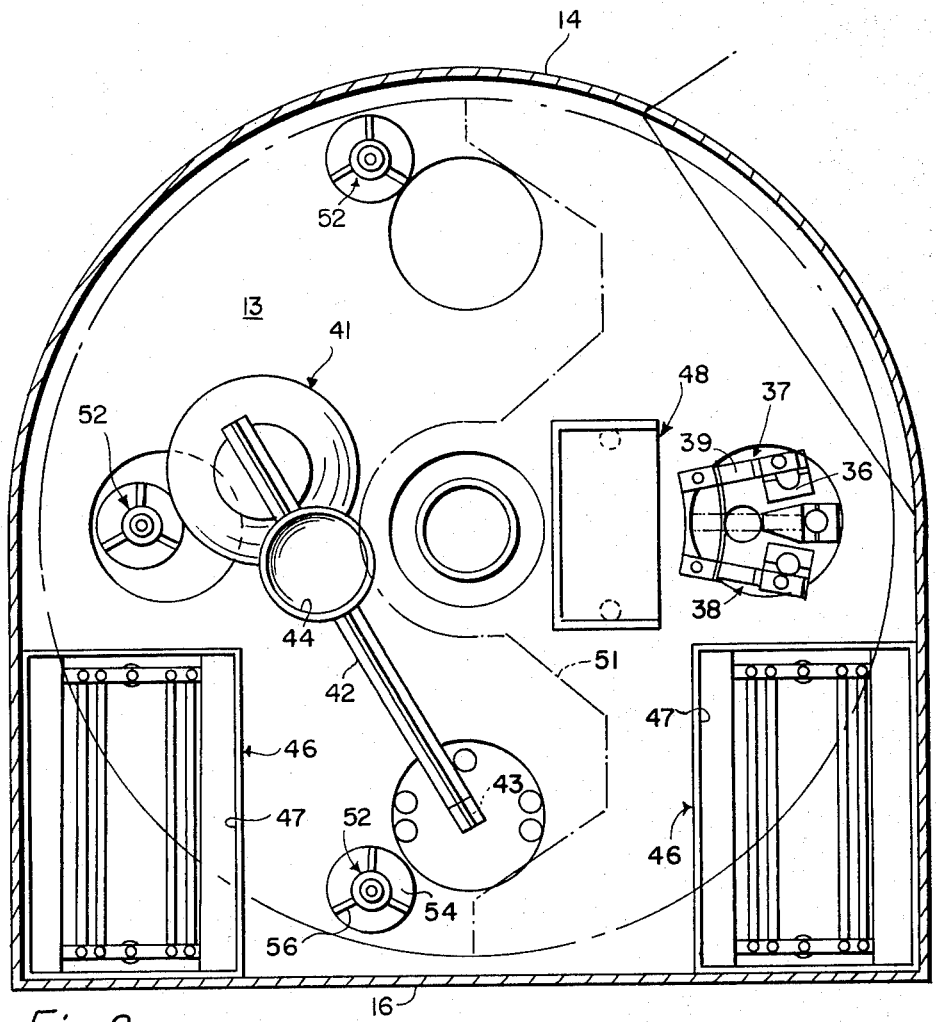
FIG. 2 is a cross-sectional view taken along the line 2—2 of FIG. 1.

At least one source is disposed in the chamber 11. As shown in FIG. 2 of the drawings, three separate sources 36, 37 and 38 are provided. As will be noted, the sources are positioned to one side of the vertical axis for the rack 18. The sources 36, 37 and 38 are substantially conventional and each includes a boat 39 which is formed of a resistive material so that it is heated when electrical current is passed therethrough. Each of the boats 39 is adapted to carry a coating material which, when heated by the boat, will vaporize to form a vapor stream which moves upwardly toward the substrates carried by the rack 18 to impinge thereon. Three separate sources 36, 37 and 38 have been provided in the event it is desired to utilize three different coating materials. Normally, in order to take the utmost advantages of the present invention, it is desirable to position all the sources immediately off axis in the manner in which the source 36 has been positioned. However, since this is impossible, the next best solution is to position the other sources as close as possible to the source 36 in a circumferential fashion.

Means is provided for completely covering the sources 36, 37 and 38 and consists of a cup-shaped shield 41 which faces downwardly and is secured to the outer end of an arm 42 which is pivotally mounted upon a pin 43 mounted upon the bottom wall 13 of the housing 11. The shield 41 is movable between a position overlying the sources 36, 37 and 38, and an out-of-the-way position as shown in solid lines in FIG. 2. A catch basin 44 is also mounted upon the arm 42 and faces upwardly and is normally positioned during the coating operation so that it immediately underlies the cage 31 of the chip changer and collects the chips as they are ejected from the chip changer.

A pair of radiant heaters 46 are mounted upon the bottom wall 13 of the housing and each includes a reflector 47. The heaters 46 are of conventional construction and are provided for the purpose of outgassing the chamber 11 and for heating up the substrates to be coated.

An ion generator 48 of conventional construction is also mounted in the bottom wall 11 and is provided for the purpose of cleaning the substrate and outgassing the tank and fixtures.

Means is provided for interrupting a substantial portion or portions of the vapor stream or streams arising from the source or sources so that they cannot impinge upon the substrates carried by the rack 18 and consists of a large stationary shield or mask 51. The shield or mask 51 is disposed between the sources 36, 37 and 38 and the rotating rack 18. Suitable means is provided for mounting the mask 51 and consists of three posts 52. Each of the posts consists of a rod 53 which is mounted upon a base plate 54 secured to the bottom wall 13 of the housing or chamber 11. Reinforcing ribs 56 extend longitudinally of the rod 53 and are also secured to the base plate 54. Threaded studs 57 are rotatably mounted in the mask 51 and are threaded into the tubular rods 53 and are locked in position by nuts 58 and washers 59.

Figure 3:
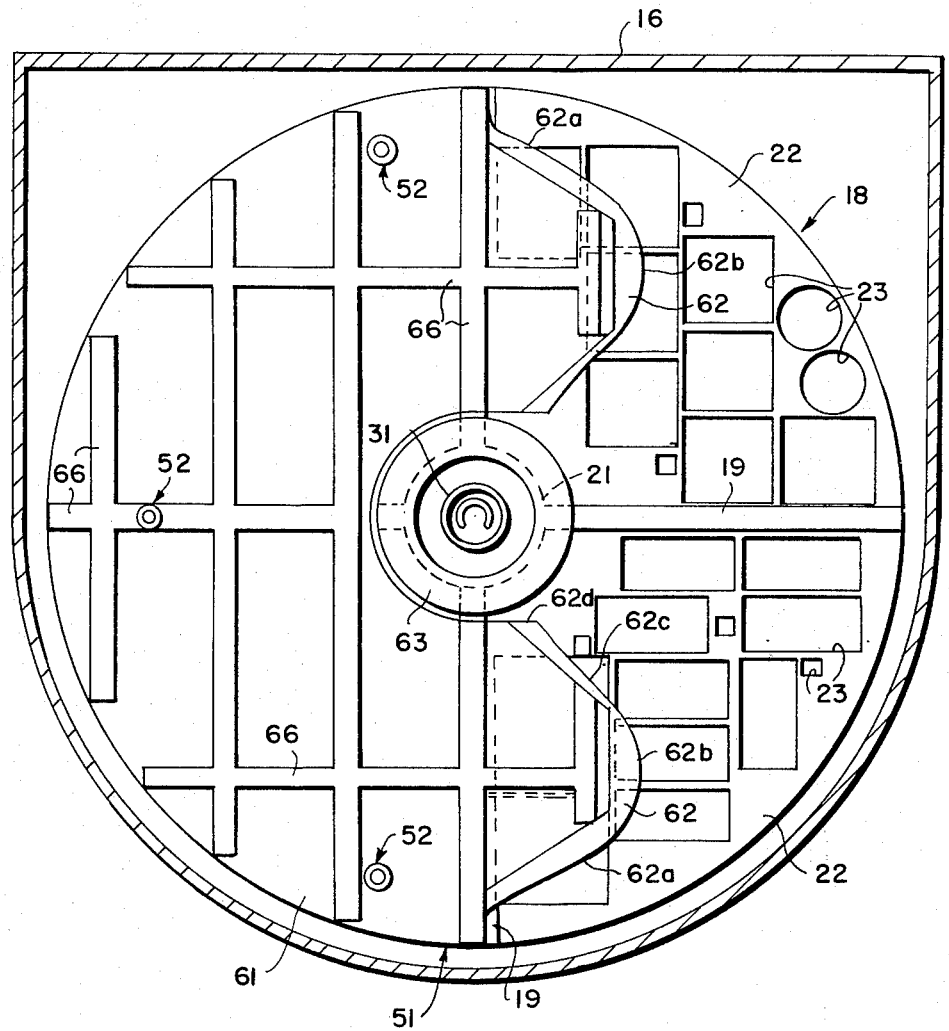
FIG. 3 is a cross-sectional view taken along the line 3—3 of FIG. 1.

The mask 51 itself consists of a large plate 61 of substantial thickness which, in the embodiment shown in FIG. 3, is in the form of a semi-circle which subtends substantially 180°. The plate 61, however, is provided with a pair of forwardly extending ears or lobes 62 which are spaced apart on opposite sides of the chip changer. In horizontal plan, it will be noted that the ears or lobes 62 are in the form of mounds which have an upwardly sloping portion 62a, a rounded top portion 62b, and a downwardly inclined portion 62c, which portion is inclined at a substantially lesser angle than the portion 62a and a relatively straight portion 62d. The straight portion 62d joins with a semi-circular recess 63 provided in the plate 61 to accommodate the chip changer hereinbefore described. The plate 61 is provided with reinforcing bars 66 to prevent buckling of the plate. These reinforcing bars are U-shaped in cross-section and extend at 90° with respect to each other to provide a multiple rectangular reinforcing grid.

Operation and use of the coating apparatus in performing the present method may now be briefly described as follows. Let it be assumed that the apparatus has been placed in operation and that the materials which are to be utilized for coating have been placed in the sources 36, 37 and 38. Let it also be assumed that the rack 18 carrying the substrates is rotating and that one of the sources 36, 37 and 38 is being heated to cause evaporation of the material contained therein to produce a vapor stream which is impinging upon the substrates carried by the rack. At the same time, the same vapor stream is impinging upon the chip carried by the cage 31 of the chip changer. Since the chip changer is centrally disposed and is never obstructed, it is continuously exposed to the vapor streams from the sources 36, 37 and 38.

With the mask 51 covering at least one-half the area of the rack 18, it can be seen that the substrates or parts carried by the rack are only exposed to the vapor stream less than one-half the time that the chip within the chip changer is being exposed. It has been found that this is advantageous because it permits greater accuracy in the coating of the substrates carried by the rack. This is true because in order to place a layer having a thickness of one-quarter of the design wave length, it is necessary to place a layer of approximately twice the thickness upon the chip which is being monitored. Thus, if an error of 1 percent is made in the thickness on the controlled chip, the error in the thickness of the layer on the substrates will only be one-half of 1%. Thus, it can be seen that by interrupting a substantial portion of the vapor stream, it is possible to increase the accuracy of the thickness of the layer deposited upon the substrates.

Another very substantial advantage of the use of the large mask 51 is that the large mask serves to interrupt the portions of the vapor stream which have the larger angles of incidence. This is important because it is well known that the mechanical strength and adhesion of a coating depends on the angle at which the coating material is deposited upon the substrates. With the arrangement shown in which the sources 36, 37 and 38 are positioned off axis to one side of the coating apparatus or on the side opposite which the large mask or shield 51 is located, it can be seen that substantially normal angles of deposition are made possible. The shield or mask 51 serves to interrupt those portions of the vapor stream which have substantially greater angles of incidence. In any event, the shield certainly can be used for preventing vapor streams impinging upon the substrates which have an angle of incidence which is greater than 45° from the normal.

By way of example, it has been found that with a rack having a diameter of approximately 40 inches, it would be ideally suitable to position the sources 10 inches off the center axis so that the angles of incidence on both sides are equal. However, it has been found by experimentation that the position of approximately 14 inches from the center axis gives better results for a rack of the 40 inch size.

By experimentation, it also has been found that substantially better results can be obtained with a mask or shield in which the leading edges have been modified rather than being straight. In FIG. 4, a graph shows the run-off in film thickness in relation to the rack radius. Curve 71 shows the actual run-off which has been obtained with a substantially 180° mask as shown in the drawings. The curve 72 represents the theoretical run-off if no mask were present, whereas curve 73 represents the actual run-off with a 180° mask in which the leading or front edges have not been modified. Therefore, it can be clearly seen from FIG. 4 that the present modified mask disclosed herein gives much better results with substantially no run-off.

It is apparent from the foregoing that we have provided a new and improved coating apparatus and method in which it is possible to substantially increase the accuracy of deposition and also to reduce the angle of incidence to increase the hardness and mechanical strength of the coating. Although the apparatus and method has a slight disadvantage in that some of the coating material is lost on the mask, this disadvantage is far outweighed by the advantages.

We claim:

1. In a coating apparatus for producing coatings having a substantially uniform thickness, a vacuum chamber, a rack having a radius of greater than approximately twenty inches rotatably mounted in the chamber for rotation about a vertical axis, said rack being adapted to carry a plurality of substrates to be coated in positions spaced transversely from the axis of rotation and mounted at different angular positions on the rack ranging through the entire 360° of the rack, means for rotating the rack and the substrates carried thereby, a stationary source disposed in the chamber and containing a coating material which evaporates to produce a vapor stream directed towards all of said substrates carried by the rack, and a stationary mask disposed in said chamber between said source and said rack, said mask subtending approximately 180° and interrupting a substantial portion of the vapor stream including that portion of the vapor stream having the greatest angle of incidence with respect to the substrates carried by the rack whereby all of said substrates on said rack are sequentially coated with a coating of substantially uniform thickness, by a vapor stream that is generally normal to exposed substrates said mask being formed to permit a plurality of substrates carried by the rack and disposed at different angles to be exposed simultaneously to the vapor stream from the source, said mask including frontally protruding masking portions which are arcuate in a somewhat sinusoidal manner and which are uniformly spaced from said vapor source and the axis of rack rotation, said mask and vapor source being each transversely spaced from the axis of rack rotation and upon opposed sides of a diameter passing through said axis of rack rotation, and monitor chip means operatively associated with said mask, rack and said source so as to be directly and continuously exposed to said vapor stream.

2. Apparatus as in claim 1 wherein said monitor chip is centrally disposed with respect to said rack.

* * * * *